(12) United States Patent
Brown

(10) Patent No.: US 7,283,596 B2
(45) Date of Patent: Oct. 16, 2007

(54) PAM-4 DATA SLICER HAVING SYMMETRICAL OFFSET

(75) Inventor: William W. Brown, Los Altos, CA (US)

(73) Assignee: Avago Technologies General IP (Singapore) Pte Ltd, Singapore (SG)

( * ) Notice: Subject to any disclaimer, the term of this patent is extended or adjusted under 35 U.S.C. 154(b) by 722 days.

(21) Appl. No.: 10/616,214

(22) Filed: Jul. 8, 2003

(65) Prior Publication Data

US 2005/0008099 A1    Jan. 13, 2005

(51) Int. Cl.
*H03K 9/00* (2006.01)
(52) U.S. Cl. .................. 375/316; 318/678; 327/52; 327/89; 327/96; 327/127; 327/246; 327/266; 327/274; 327/280; 327/287; 327/359; 327/563; 330/252; 375/318
(58) Field of Classification Search .............. 375/219, 375/268, 296, 316, 317, 354, 373; 330/256, 330/257, 296; 327/357; 708/835
See application file for complete search history.

(56) References Cited

U.S. PATENT DOCUMENTS

| | | | | |
|---|---|---|---|---|
| 5,363,062 A | * | 11/1994 | Nebuloni et al. | 330/296 |
| 5,517,532 A | * | 5/1996 | Reymond | 375/354 |
| 5,699,386 A | * | 12/1997 | Measor et al. | 375/350 |
| 6,313,885 B1 | * | 11/2001 | Patel et al. | 348/725 |
| 2003/0108092 A1 | * | 6/2003 | Gorecki et al. | 375/219 |

* cited by examiner

*Primary Examiner*—David C. Payne
*Assistant Examiner*—Adolf DSouza

(57) ABSTRACT

A PAM-4 data slicer includes first, second, and third comparators which provide first, second, and third thresholds, respectively. Each of the comparators has an offset. The first and third comparators have an offset generating arrangement at their outputs to provide the first and third comparator circuits with symmetrical offsets.

15 Claims, 1 Drawing Sheet

PAM-4 DATA SLICER HAVING SYMMETRICAL OFFSET

BACKGROUND OF THE INVENTION

Data slicers are well known in the art. They can be one key element of a data transmission system. A data slicer receives an analog input signal and returns at its output a digital signal which is its estimate of the digital information sent during that baud period. A binary slicer accepts an analog input (usually described to be scaled between a minimum of −1 and a maximum of +1) and returns a digital binary output. The logical equivalent of a data slicer is to provide an output of −1 for input signals less than zero and an output of +1 for inputs greater than zero.

Multilevel data transmission systems quantize transmitted data into more than two levels, thereby using less channel bandwidth than the same capacity binary system. One such multilevel data transmission system is PAM-4, which encodes sequential pairs of binary data, such as, −1−1, −1+1, +1−1, and +1+1 into a four-level signal as for example, −3, −1, +1, and +3, respectively. The slicer at the PAM-4 receiver must reconstruct the transmitted signal by comparing the input to three different thresholds, −2, 0, and +2. Hence, if the input is less than −2, then the slicer output is −3. If the input is greater than −2 but less than zero, then the slicer output is −1. If the input is greater than zero but less than +2, the output is +1. If the input is greater than 2, then the output is +3.

Since transistors are inherently binary devices, and are most easily and reliable switchable between two states (on, off), PAM-4 slicers are usually physically realized using a combination of three binary slicers, with the reference input of each slicer tied, at least in concept, to −2, 0, and +2, respectively. The two binary data bits are then reconstructed using a simple logic circuit.

Practical implementations of PAM-4 slicers for a monolithic modern high speed communication system, especially one implemented in low voltage complementary metal oxide semiconductor (CMOS), is difficult. All of the high speed analog signals are run differentially. The problem therefore presents itself as to how to introduce the appropriate DC offsets into the signals provided to the +2 binary slicer and the −2 binary slicer. Still further, it is desirable to provide offset voltages for the upper and lower binary comparators which are symmetrical to assure that the thresholds of the upper and lower binary comparators are equally spaced from the threshold of the intermediate comparator. The present invention addresses this need.

SUMMARY OF THE INVENTION

In accordance with one aspect of the present invention, a data slicer includes a first comparator circuit that establishes a first threshold, a second comparator circuit that establishes a second threshold, and a third comparator circuit that establishes a third threshold, wherein the second threshold is greater than the first threshold and less than the third threshold. Each of the comparator circuits has an offset and the first and third comparator circuits have symmetrical offsets.

The symmetrical offsets of the first and third comparators are provided at the outputs of the first and third comparator circuits. Further, each of the first and third comparator circuits includes a load resistor having a center tap and the load resistor center tap of the first comparator circuit is coupled to the load resistor center tap of the third comparator circuit to provide the first and second comparator circuits with symmetrical offsets.

Preferably, the first and third thresholds are equally spaced from the second threshold. Also, preferably, the comparator circuits are formed from complimentary metal oxide semiconductor devices.

In accordance with further aspects of the invention, the invention provides an integrated circuit including a substrate of semiconductor material and a data slicer formed in the semiconductor material. The data slicer includes a first comparator circuit that establishes a first threshold, a second comparator circuit that establishes a second threshold, and a third comparator circuit that establishes a third threshold. The second threshold is greater than the first threshold and less than the third threshold. Each of the comparator circuits has an offset and the first and third comparator circuits have symmetrical offsets.

BRIEF DESCRIPTION OF THE DRAWING

The foregoing aspects and many of the attended advantages of this invention will become more readily appreciated as the same become better understood by reference to the following detailed description, when taken in conjunction with the accompanying drawing, wherein the sole FIGURE is a schematic circuit diagram of a PAM-4 data slicer embodying the present invention.

DESCRIPTION OF THE INVENTION

Figure 1:
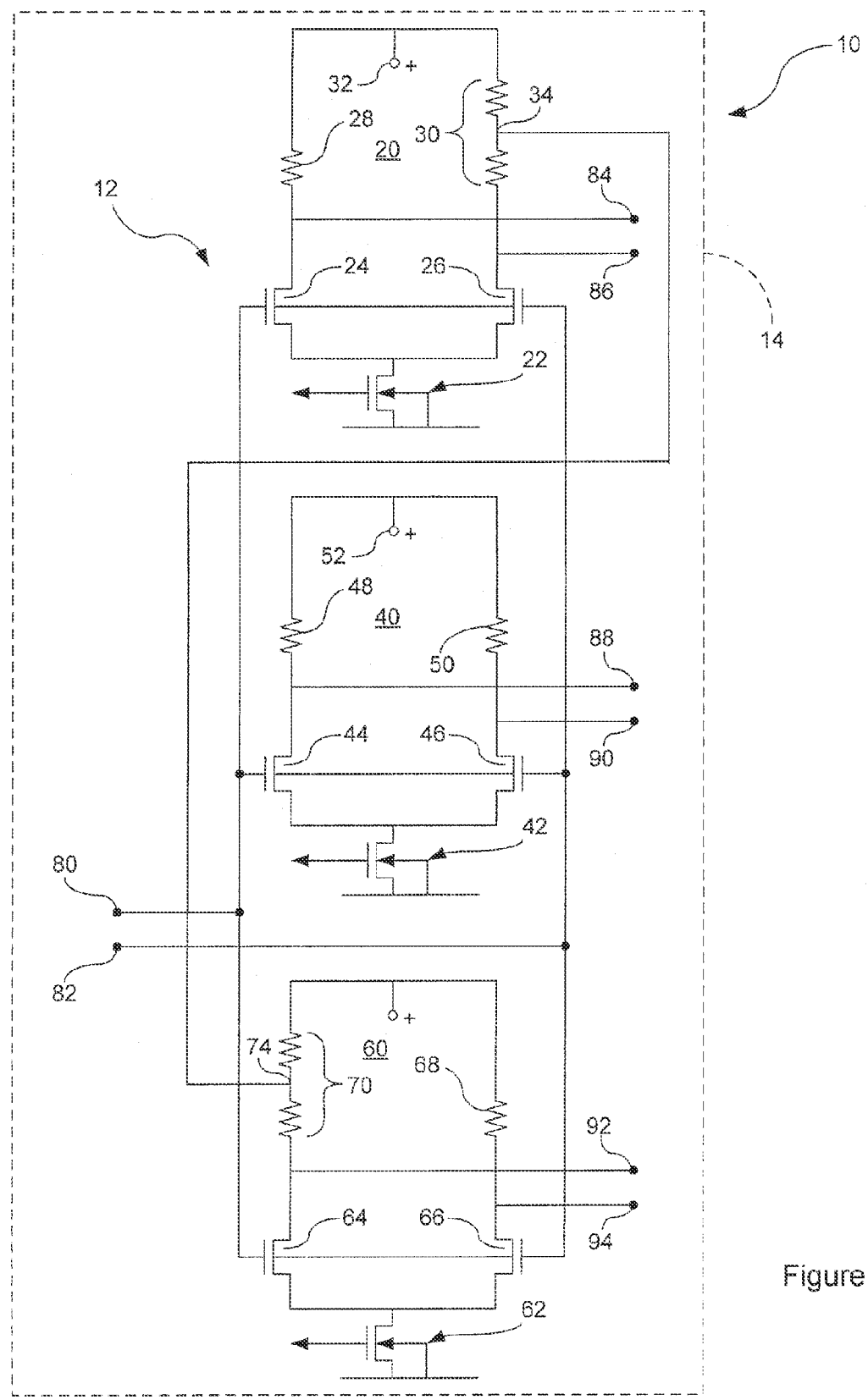

Referring now to the sole FIGURE, it illustrates an integrated circuit 10 having a PAM-4 data slicer 12 embodying the present invention formed within a semiconductor substrate 14 of the integrated circuit 10. The data slicer 12 generally includes a first comparator circuit 20, a second comparator circuit 40, and a third comparator circuit 60. The first comparator circuit 20 provides a first threshold, the second comparator circuit 40 provides a second threshold, and the third comparator circuit 60 provides a third threshold. Preferably, the second threshold is greater than the first threshold and less than the third threshold. Further, in accordance with traditional PAM-4 data slicers, the first and third thresholds are equally spaced from the second threshold. As previously mentioned, the first, second, and third thresholds may be equivalently −2, 0, and +2, respectively.

The first comparator circuit 20 includes a current source 22, a pair of CMOS field effect transistors (FETs) 24 and 26, and output load resistances 28 and 30. The sources of transistors 24 and 26 are coupled together and to the drain of the transistor forming the current source. Resistor 28 is coupled between the drain of transistor 24 and a positive power terminal 32. The output resistance 30 is coupled between the drain of transistor 26 and the power terminal 32. As will be noted in the FIGURE, the output load resistance 30 takes the form of a center tapped resistor having a center tap 34.

Similarly, the second comparator circuit 40 includes a current source 42, a pair of CMOS FETs 44 and 46, and load resistances 48 and 50. The third comparator circuit 60 still further similarly includes a current source 62, a pair of CMOS FETs 64 and 66, and output load resistances 68 and 70. The output load resistance 70 is a center tapped load resistor having center tap 74.

The values of the load resistances are selected such that comparator circuit 20 provides the lower threshold, comparator 40 provides the intermediate threshold, and comparator 60 provides the upper threshold. The load resistances are further selected such that the upper and lower thresholds are equally spaced from the intermediate thresholds.

The inputs of the comparator circuits 20, 40, and 60 are combined to form the common input terminals 80 and 82. The first comparator circuit 20 has output terminals 84 and 86, the second comparator circuit 40 has output terminals 88 and 90, and the third comparator circuit has output terminals 92 and 94.

As previously mentioned, the data slicer 12 establishes three thresholds to provide four distinct outputs depending on the relationship of the input signal to the three thresholds. To provide a single output for a respective given input signal condition, the output terminals 84, 86, 88, 90, 92, and 94 are preferably coupled to a logic circuit of the type well known in the art.

In accordance with the present invention, the center tapped load resistances 30 and 70 form offset generating circuits. Because the offset generating circuits are at the comparator outputs, unmatched voltage division and bandwidth matching problems are avoided. Since the output load resistances 30 and 70 are center tapped, the offsets of the comparators are inherently symmetrical. The offsets introduced at the outputs of comparators 20 and 60 are produced by a linear combination of the high and low current sources 62 and 22 flowing through the parallel combination of the two offset-inducing resistors. Because of this linear combination, the offset load is essentially constant over the entire range of input voltages.

Because of the voltage stability of this node over a wide range of input voltages, the single-ended output impedance of each side of each comparator is essentially unaffected by the offset inducement arrangement. This characteristic preserves the balanced nature of the comparator, including common mode rejection and high frequency gain/bandwidth maximization. Further, by introducing the offset at the comparator outputs, the comparators and hence the slicer have the maximum possible gain/bandwidth for a given form of integrated circuit.

As can be seen from the foregoing, the present invention provides a PAM-4 data slicer having inherently symmetrical DC offsets. The PAM-4 slicer in accordance with the present invention further preserves the differentially matched characteristics of a simple binary comparator. Hence, a PAM-4 data slicer structured in accordance with the present invention is ideally suited for use in reconstruction of high speed PAM-4 data.

While particular features and aspects of the present invention have been shown and described, modifications may be made. It is therefore intended in the appended claims to cover all such changes and modifications which fall within the true spirit and scope of the invention.

I claim:

1. A data slicer comprising:
   a first differential comparator circuit that establishes a first threshold and that includes first and second output nodes having respective first and second polarities;
   a second differential comparator circuit that establishes a second threshold and that includes first and second output nodes having respective first and second polarities; and
   a third differential comparator circuit that establishes a third threshold and that includes first and second output nodes having respective first and second polarities;
   wherein the second threshold is greater than the first threshold and less than the third threshold,
   wherein each of the differential comparator circuits has an offset,
   wherein the first and third differential comparator circuits have symmetrical offsets, and
   wherein the first output node of the first differential comparator is coupled to the second output node of the third differential comparator.

2. The data slicer of claim 1 wherein:
   each of the differential comparator circuits includes first and second branches coupled to the respective first and second output nodes;
   the first branch of the first differential comparator includes a first impedance element coupled to the first output node and a second impedance element coupled to the first impedance element at an offset node;
   the second branch of the third differential comparator includes a first impedance element coupled to the second output node and a second impedance element coupled to the first impedance element at an offset node; and
   the offset node of the first differential comparator is coupled to the offset node of the third differential comparator.

3. The data slicer of claim 2 wherein each impedance element comprises a resistor.

4. The data slicer of claim 1 wherein the first and third thresholds are equally spaced from the second threshold.

5. The data slicer of claim 1 wherein the differential comparator circuits are formed from complimentary metal oxide semiconductor devices.

6. A data slicer comprising:
   a first comparator circuit that establishes a first threshold;
   a second comparator circuit that establishes a second threshold; and
   a third comparator circuit that establishes a third threshold;
   wherein the second threshold is greater than the first threshold and less than the third threshold,
   wherein each of the comparator circuits has an offset,
   wherein the first and third comparator circuits have symmetrical offsets, and
   wherein each of the first and third comparator circuits includes a load resistor having a center tap and wherein the load resistor center tap of the first comparator circuit is coupled to the load resistor center tap of the third comparator circuit to provide the first and second comparator circuits with symmetrical offsets.

7. A data slicer comprising:
   a first differential comparator circuit that establishes a first threshold and that includes first and second output nodes having respective first and second polarities and an output circuit coupled to the first output node;
   a second differential comparator circuit that establishes a second threshold and that includes first and second output nodes having respective first and second polarities and an output circuit coupled to the first output node; and
   a third differential comparator circuit that establishes a third threshold and that includes first and second output nodes having respective first and second polarities and an output circuit coupled to the first output node;
   wherein the second threshold is greater than the first threshold and less than the third threshold,
   wherein each of the differential comparator circuits has an offset,
   wherein the first and third differential comparator circuits have output circuits providing symmetrical offsets, and wherein the output circuit of the first differential comparator is coupled to the output circuit of the third differential comparator.

8. The data slicer of claim 7 wherein the first and third thresholds are equally spaced from the second threshold.

9. The data slicer of claim 7 wherein the differential comparator circuits are formed from complimentary metal oxide semiconductor devices.

10. A data slicer comprising:
a first comparator circuit that establishes a first threshold;
a second comparator circuit that establishes a second threshold; and
a third comparator circuit that establishes a third threshold;
wherein the second threshold is greater than the first threshold and less than the third threshold;
wherein each of the comparator circuits has an offset,
wherein the first and third comparator circuits have output circuits providing symmetrical offsets, and
wherein the output circuit of each of the first and third comparator circuits includes a load resistor having a center tap and wherein the load resistor center tap of the first comparator circuit is coupled to the load resistor center tap of the third comparator circuit to provide the first and second comparator circuits with the symmetrical offsets.

11. An integrated circuit comprising:
a substrate of semiconductor material; and
a data slicer formed in the semiconductor material, the data slicer including,
a first differential comparator circuit that establishes a first threshold and that includes first and second output nodes having respective first and second polarities,
a second differential comparator circuit that establishes a second threshold and that includes first and second output nodes having respective first and second polarities, and
a third differential comparator circuit that establishes a third threshold and that includes first and second output nodes having respective first and second polarities,
wherein the second threshold is greater than the first threshold and less than the third threshold,
wherein each of the differential comparator circuits has an offset,
wherein the first and third differential comparator circuits have symmetrical offsets, and
wherein the first output node of the first differential comparator is coupled to the second output node of the third differential comparator.

12. The integrated circuit of claim 11 wherein the first and third differential comparator circuits have output circuits providing the symmetrical offsets.

13. The integrated circuit of claim 11 wherein the first and third thresholds of the data slicer are equally spaced from the second threshold.

14. The integrated circuit of claim 11 wherein the differential comparator circuits are formed from complimentary metal oxide semiconductor devices.

15. An integrated circuit comprising:
a substrate of semiconductor material; and
a data slicer formed in the semiconductor material, the data slicer including,
a first comparator circuit that establishes a first threshold,
a second comparator circuit that establishes a second threshold, and
a third comparator circuit that establishes a third threshold,
wherein the second threshold is greater than the first threshold and less than the third threshold,
wherein each of the comparator circuits has an offset,
wherein the first and third comparator circuits have symmetrical offsets, and
wherein each of the first and third comparator circuits includes a load resistor having a center tap and wherein the load resistor center tap of the first comparator circuit is coupled to the load resistor center tap of the third comparator circuit to provide the first and second comparator circuits with symmetrical offsets.

* * * * *